United States Patent [19]

Chou et al.

[11] Patent Number: 5,506,006
[45] Date of Patent: Apr. 9, 1996

[54] PROCESS FOR DEPOSITING SILICON DIOXIDE BY LIQUID PHASE DIPOSITION

[75] Inventors: Jeng-Shiuh Chou; Si-Chen Lee, both of Taipei, Taiwan

[73] Assignee: National Science Council, Taipei, Taiwan

[21] Appl. No.: 456,425

[22] Filed: Jun. 1, 1995

Related U.S. Application Data

[63] Continuation of Ser. No. 237,686, May 4, 1994, abandoned.
[51] Int. Cl.$^6$ ............................................................. B05D 1/18
[52] U.S. Cl. ............................................................. 427/430.1
[58] Field of Search ........................................... 427/430.1

[56] References Cited

U.S. PATENT DOCUMENTS

| | | | |
|---|---|---|---|
| 5,073,408 | 12/1991 | Goda et al. | 427/169 |
| 5,236,874 | 8/1993 | Pintchovski | 437/245 |
| 5,270,233 | 12/1993 | Hamatake | 437/44 |
| 5,286,664 | 2/1994 | Horiuchi | 437/44 |

OTHER PUBLICATIONS

H. Nagayama et al., "A New Process for Silica Coating," J. Electrochemical Society 135(8) PP. 2013–2016 1988.
Websters Ninth New Collegiate Dictionary 1986 p. 1097.

*Primary Examiner*—Benjamin Utech
*Attorney, Agent, or Firm*—Lackenbach Siegel Marzullo Aronson & Greenspan

[57] ABSTRACT

A process for depositing a silicon dioxide ($SiO_2$) film on a substrate by liquid phase deposition is developed. Silicic acid is used instead of $SiO_2$ powder to saturate hydrofluorosilicic acid so as to shorten the period required for preparing the solution to 3 hours. Water is used to supersaturate the solution. The corresponding deposition rate of $SiO_2$ is about 50 nm per hour.

8 Claims, 6 Drawing Sheets

PROCESS FOR DEPOSITING SILICON DIOXIDE BY LIQUID PHASE DIPOSITION

This is a continuation of application Ser. No. 08/237,686, filed May 4, 1994, now abandoned.

BACKGROUND OF THE INVENTION

1. Field of the Invention

The present invention relates to a liquid phase deposition process for depositing silicon dioxide ($SiO_2$), more particularly to a $SiO_2$ deposition process using silicic acid instead of $SiO_2$ powder to saturate hydrofluorosilicic acid.

2. Description of the Prior Art

Silicon dioxide is the most widely used insulator in semiconductor devices. This material can be grown by many techniques, including thermal oxidation, chemical vapor deposition (CVD), sputtering, e-gun evaporation, and liquid phase deposition (LPD). Among these, LPD is a low temperature process which can grow silicon dioxide at temperatures lower than 50° C. LPD has such advantages as the fact that the formation of the film is possible at a low temperature, the equipment is simple and cheap, and the throughput is high. Moreover, the qualities of the films are relatively good, enabling the films to be used for producing electronic components.

For example, Yoshitomi et al. use LPD-grown oxide as the insulator of a metal-oxide-semiconductor (MOS) capacitor. They have found that the quality of the oxide can be improved after it is annealed at 400° C. in $O_2$ for 30 minutes (*Proceeding of 1992 International Electron Devices and Material Symposium*, p.22, Taipei, Taiwan, R.O.C., 1992). LPD-grown oxide has also been used in polycrystalline silicon thin-film transistors and is proven to be suitable for fabrication of silicon devices (Yeh et al., IEEE Electron Device Letters, 14(8), p.403, 1993)

The technique of depositing a $SiO_2$ film by LPD was first disclosed by Nagayama et al. (*J. Electrochem. Soc.*, 135(8), p.2013 (1988)). The purpose of depositing the $SiO_2$ film on a glass substrate is to prevent the out-diffusion of alkali ions from the substrate, which may degrade the performance of the liquid crystal display (LCD) fabricated on it. According to Nagayama et al., hydrofluorosilicic acid ($H_2SiF_6$) is first diluted with water to 2M. Then silica (silicon dioxide) powder is added into this solution to saturate the solution at 35° C. in the following equilibrium state:

$$H_2SiF_6 + 2\ H_2O \rightleftharpoons SiO_2 + 6\ HF \quad (1)$$

The residual silica powder is then filtered out and the temperature of the solution is raised to the growth temperature. Boric acid ($H_3BO_3$) is added to $H_2SiF_6$ to consume the hydrofluoric acid (HF) and supersaturate the solution with $SiO_2$ in accordance with the following reaction:

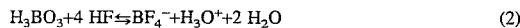

$$H_3BO_3 + 4\ HF \rightleftharpoons BF_4^- + H_3O^+ + 2\ H_2O \quad (2)$$

Thus the equilibrium in equation (1) proceeds to the right-hand side, and the amount of $SiO_2$ is increased to a supersaturation level, followed by the deposition of a $SiO_2$ film on the surface of a substrate.

The Nagayama method suffers from two drawbacks: a long saturation time (about 16 hours), and a low deposition rate, i.e., about 10–30 nm/hr with the addition of $2–3\times10^{-2}M$ boric acid. Actually, the deposition rate of $SiO_2$ depends on both the saturation level of the treatment solution and the concentration of boric acid. Use of a large quantity of boric acid may enhance the deposition rate significantly, but the deposited films may have poor quality. Raising the saturation level of the solution is another method to enhance the deposition rate, however, this requires a much longer time.

Goda et al. in their U.S. Pat. No. 5,073,408 utilize the principle that the equilibrium of the solution represented by the equation (1) proceeds to the right-hand side, when the temperature of the solution is increased. A saturating agent such as boric acid is not needed. Again, the method has the disadvantage of a very low deposition rate (not more than 6 nm/hr).

In conclusion, the conventional LPD method for depositing $SiO_2$ suffers from the problems of long saturation time and low $SiO_2$ deposition rate.

SUMMARY OF THE INVENTION

It is therefore an object of this invention to provide an improved process for depositing silicon dioxide by liquid phase deposition, in which the saturation time is shortened to about 3 hours.

Another object of this invention is to enhance the silicon dioxide deposition rate to about 50 nm/hr in the absence of boric acid.

A further object of this invention is to provide a liquid phase deposited silicon dioxide, which demonstrates relatively good properties and can be used as an insulator in a metal-oxide-semiconductor (MOS) capacitor.

To achieve the above object, the process for depositing a silicon dioxide film on a substrate comprises the steps of: (a) preparing a saturated hydrofluorosilicic acid solution by adding silicic acid to hydrofluorosilicic acid; (b) diluting the saturated hydrofluorosilicic acid solution with water to obtain a hydrofluorosilicic acid solution supersaturated with silicon dioxide to an extent necessary to deposit the silicon dioxide film on a surface of the substrate; and (c) contacting the substrate with the solution resulting from step (b) and depositing the silicon dioxide film on the surface of the substrate.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
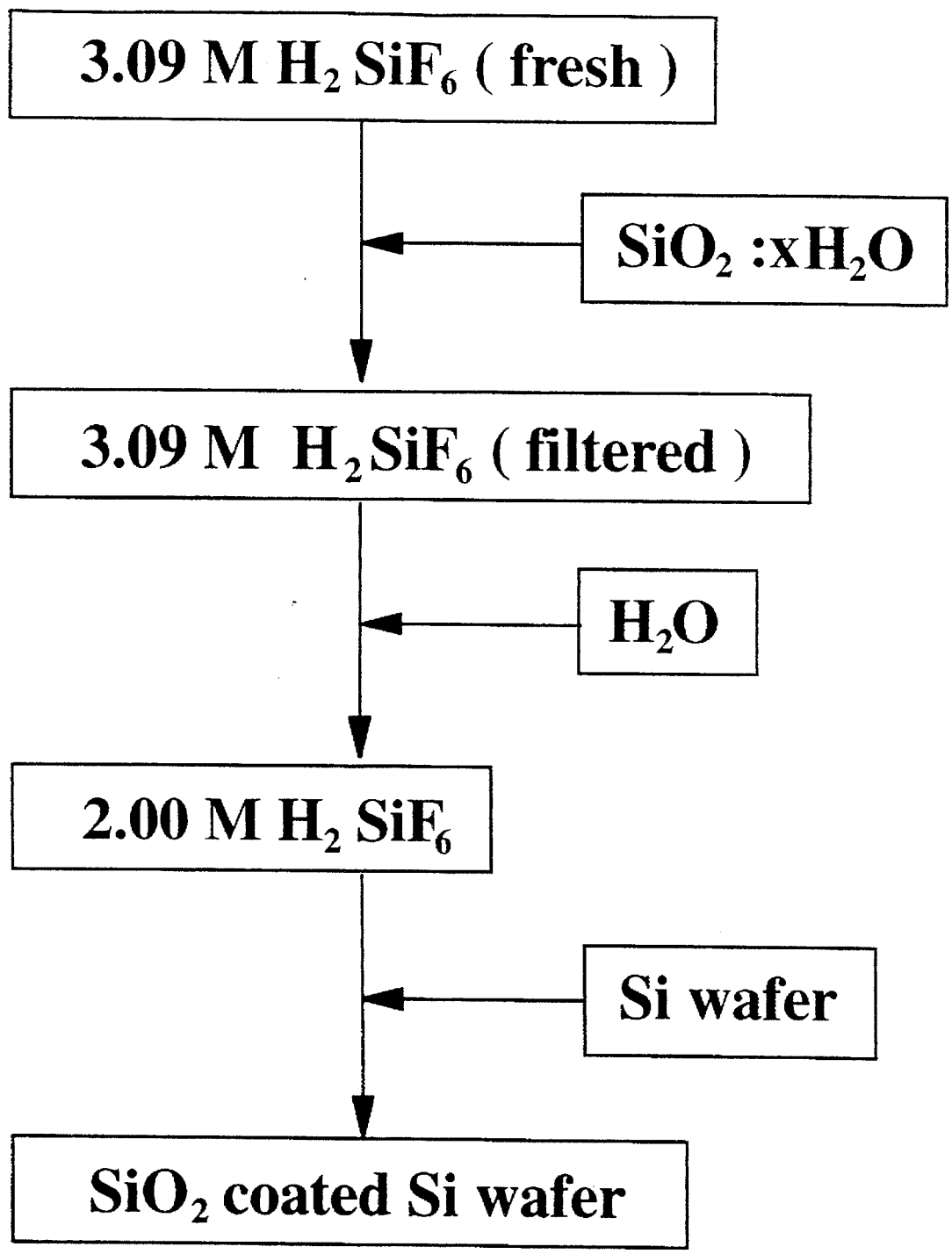
FIG. 1 is the schematic diagram of the LPD process for $SiO_2$ deposition according to the present invention.

The process of liquid phase deposition according to the present invention is shown in FIG. 1. Excess silicic acid ($SiO_2 \cdot xH_2O$) is added to hydrofluorosilicic acid ($H_2SiF_6$) to saturate it, wherein the equilibrium of the solution is represented by the following equation (1):

$$H_2SiF_6 + 2 H_2O \rightleftharpoons SiO_2 + 6 HF \qquad (1)$$

The equilibrium proceeds to the left-hand side, and the amount of $H_2SiF_6$ is increased. After about 3 hours of saturation, the solution is filtered in order to remove undissolved silicic acid.

However, this equilibrium in equation (1) may be changed by the addition of water to the treatment solution. The addition of water will lead the shift of the equilibrium from left to right, which results in deposition of silicon dioxide on the surface of a substrate.

Before immersing the substrate, if an agent for saturating silicon dioxide, such as boric acid, is added to the treatment solution, the $SiO_2$ deposition rate will be enhanced, while the electrical properties of the oxide are worse than those had boric acid not been added.

The saturating agent suitable for use in the present invention can be any other reagent capable of reacting with fluoric acid (HF). The saturating agent reacts with fluoric acid, thus making the equilibrium in equation (1) shift to the right and expediting the $SiO_2$ deposition. Examples of such saturating agents include boric acid, aluminum, ammonia water and sodium hydroxide.

The resultant $SiO_2$ deposited substrate can be fabricated into a Si MOS capacitor in which the $SiO_2$ film acts as the insulator. Also, the $SiO_2$ deposited substrate can be used in other semiconductor devices, such as amorphous silicon or polycrystalline silicon thin film transistors.

The following specific examples are intended to demonstrate this invention more fully without acting as a limitation upon its scope, since numerous modifications and variations will be apparent to those skilled in the art.

EXAMPLE 1

The operation of this example is shown in FIG. 1. Silicic acid at a proportion of 6.5 g of silicic acid per 100 ml of $H_2SiF_6$ was added to 3.09M hydrofluorosilicic acid ($H_2SiF_6$). The solution was stirred under a water bath for 3 hours at 30° C. to saturate the $H_2SiF_6$. After stirring, the solution was filtered in order to remove undissolved silicic acid and diluted with water to 2M to obtain the treatment solution.

Subsequently, the treatment solution was heated to the growth temperature of 50° C., and then mixed with the proper amount of boric acid, ranging from 0 to 0.02M. A RCA cleaned n-type silicon wafer (100) was then immersed into the treatment solution, leading to the deposition of silicon dioxide.

Figure 2:
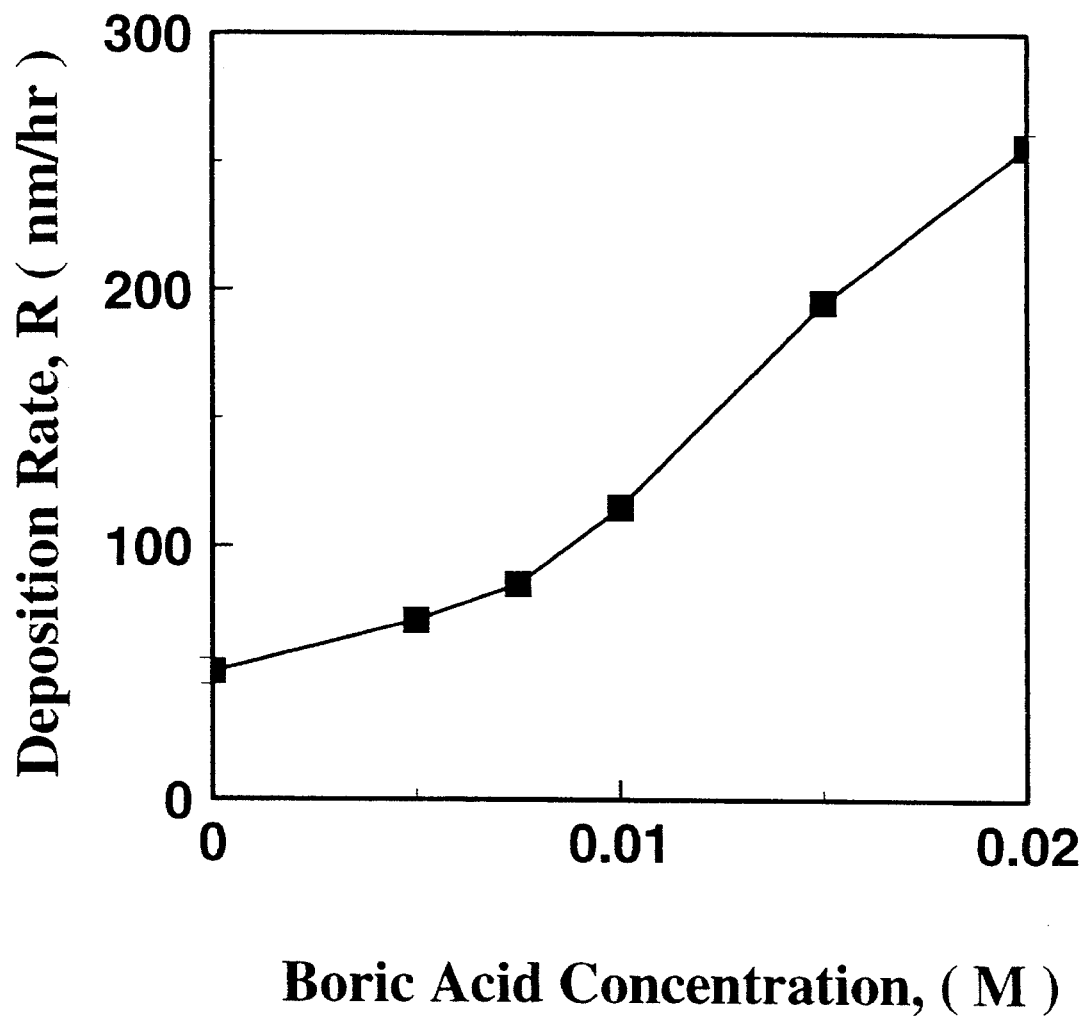
FIG. 2 is a graph showing the $SiO_2$ deposition rate versus boric acid concentration according to example 1 of the present invention.

The $SiO_2$ deposition rate as a function of boric acid concentration is shown in FIG. 2. The deposition rate with $[H_3BO_3]=0.010M$ is about 120 nm/hr, many times faster than that obtained by the conventional LPD process with the same boric acid concentration. More surprising is the fact that the $SiO_2$ layer can be grown at a growth rate of about 50 nm/hr without the addition of boric acid. This indicates that boric acid is not necessary to produce supersaturated hydrofluorosilicic acid in the present process and that the time required for saturation is much reduced. Water plays the role of driving the solution into supersaturation. This fact is revealed in equation (1) where the addition of more water makes the equilibrium move toward the right direction.

APPLIED EXAMPLE 1

In this applied example, a Si MOS capacitor using the LPD-$SiO_2$ film as the insulator is fabricated, and its electrical characteristics are investigated.

The $SiO_2$ deposited substrate resulting from example 1, in which the treatment solution contained no boric acid, was rinsed with deionized water, directly deposited with aluminum used as the gate electrodes, and etched. Post-metallization anneal (PMA) was carried out at 400° C. in $N_2$ for 30 minutes. The thickness of the oxide was 64 nm.

Figure 3:
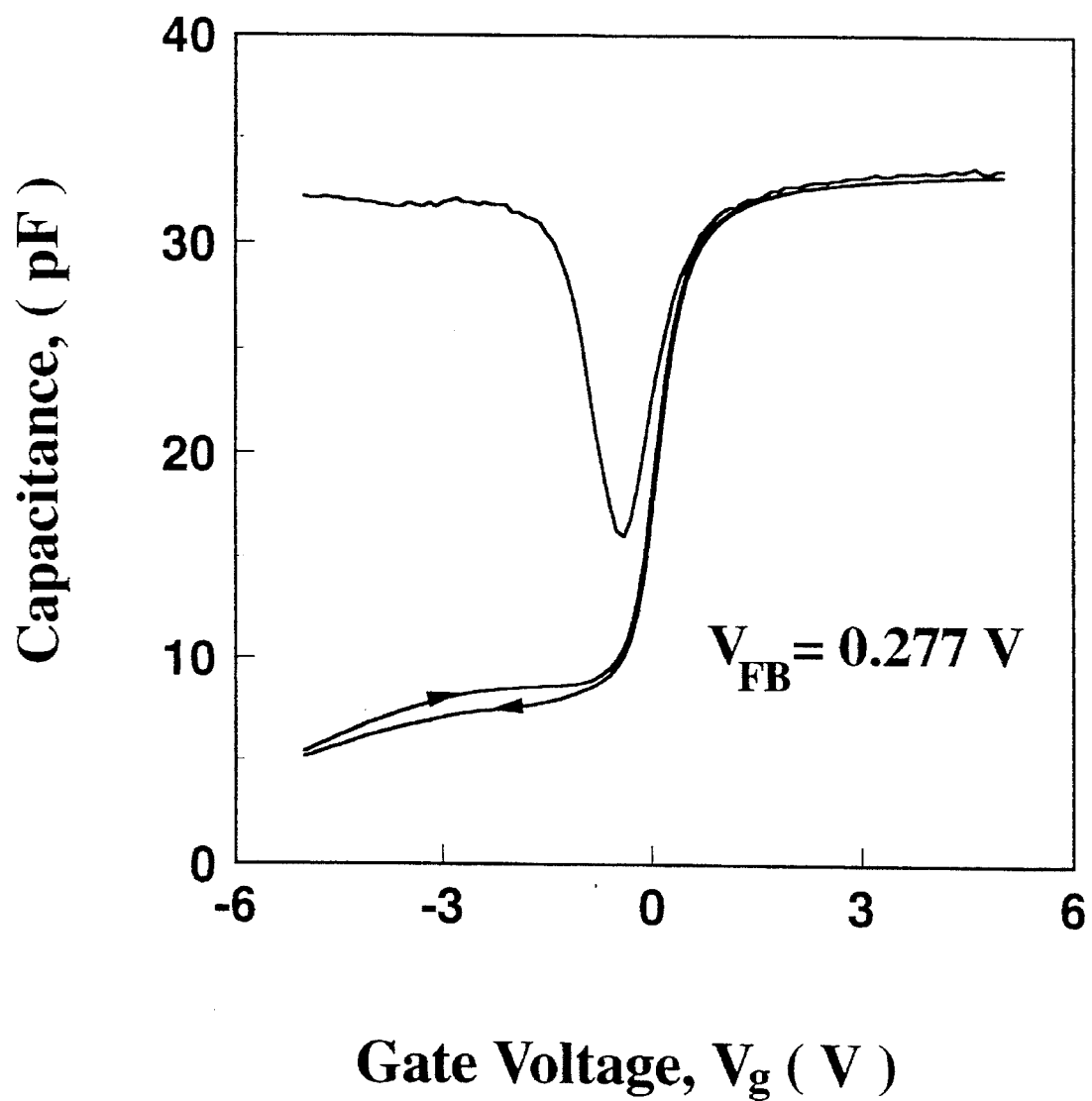
FIG. 3 shows the high-low frequency capacitance versus voltage (C-V) curves of the MOS capacitor prepared from applied example 1.
Figure 4:
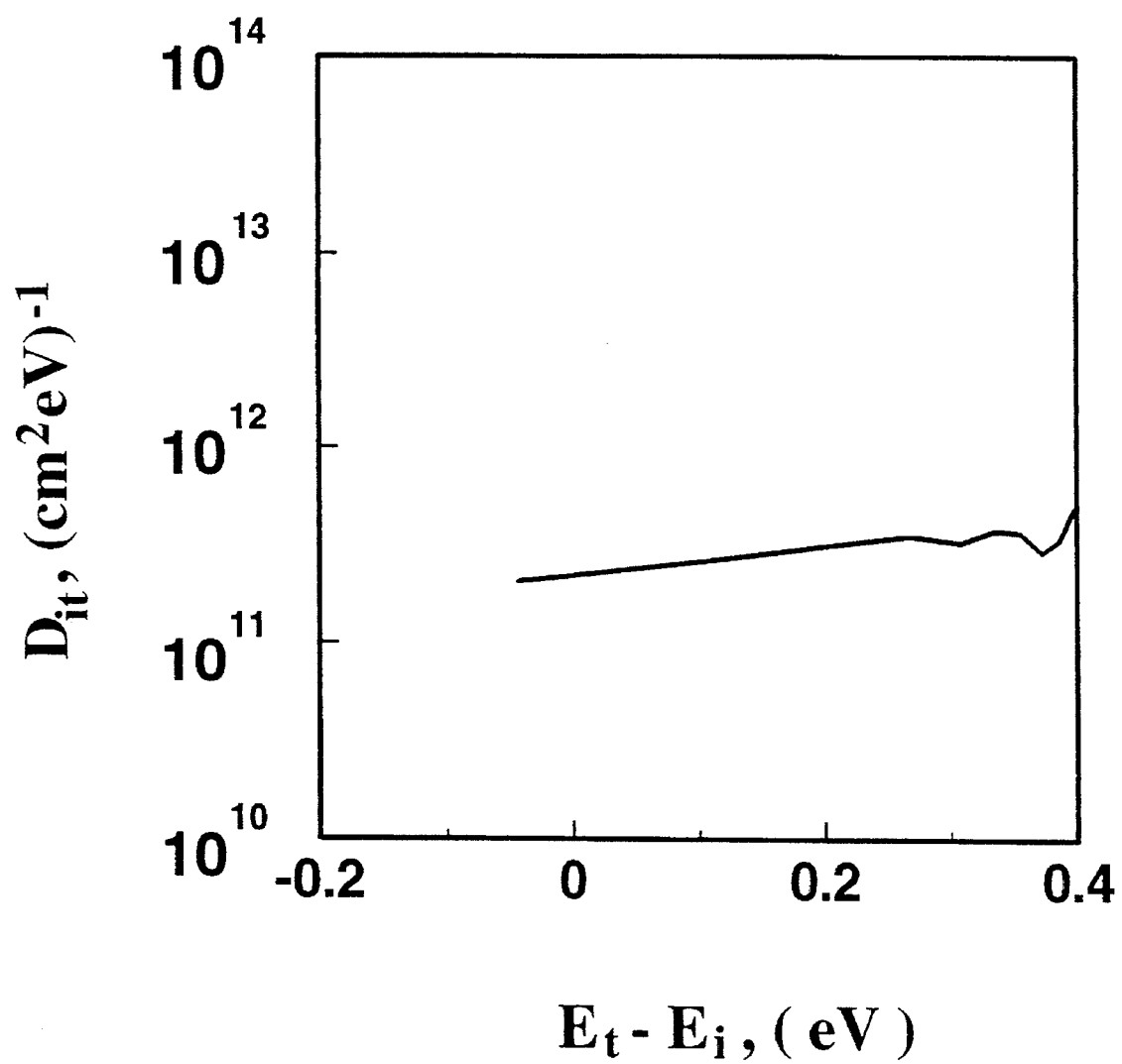
FIG. 4 shows the distribution of interface traps of the MOS capacitor prepared from applied example 1.
Figure 5:
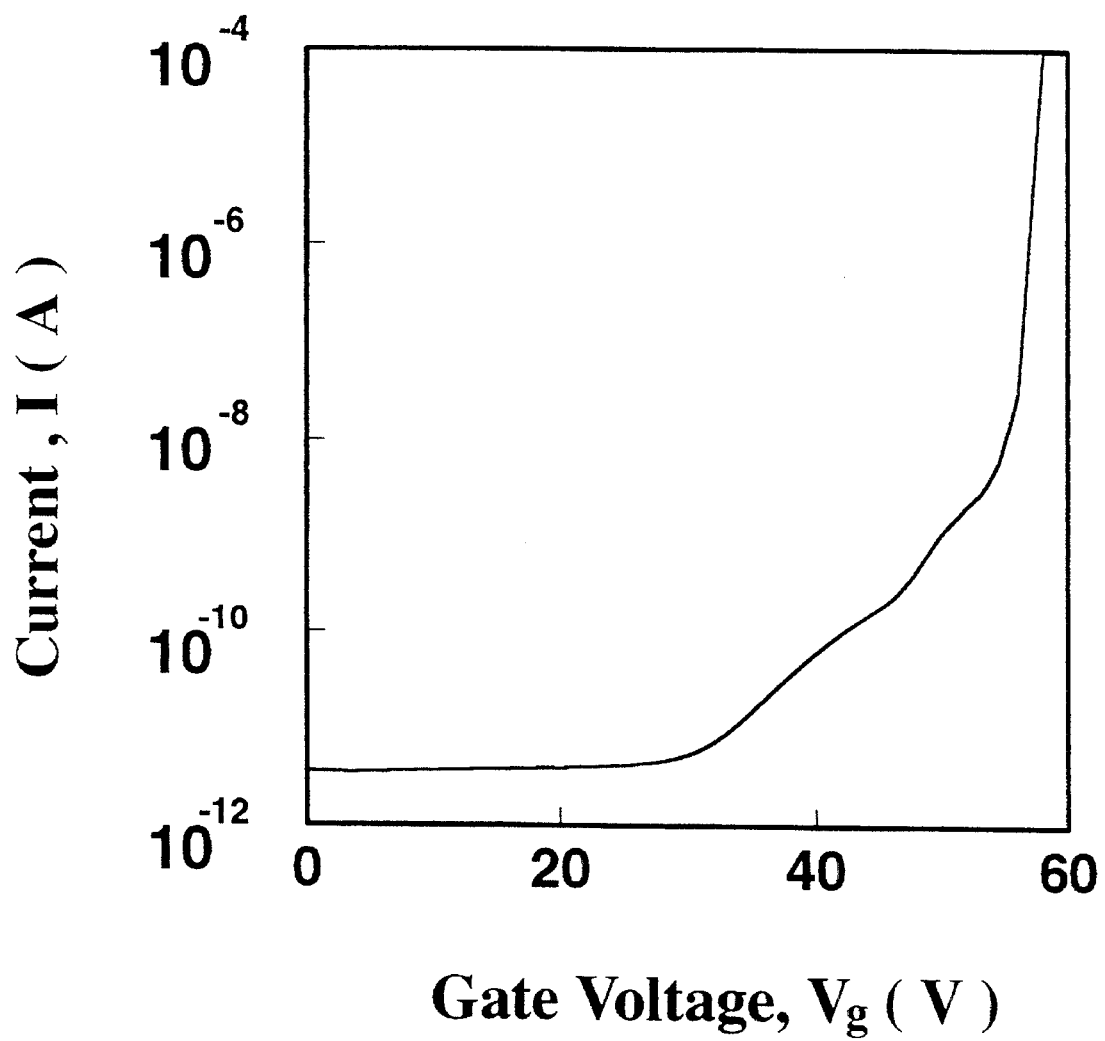
FIG. 5 shows the current versus voltage (I-V) curve of the MOS capacitor prepared from applied example 1.

FIG. 3 shows the high-low frequency (1 MHz/quasistatic) C-V characteristics of the capacitor in which two high frequency C-V curves are presented. It is clear that the slow states are almost absent. The flatband voltage of the MOS capacitor is 0.277 V, very close to the theoretical value of MOS devices. The density of interface traps ($D_{it}$) calculated from the C-V curves is almost constant in the gap with a magnitude of $3 \times 10^{11}$ cm$^{-2}$eV$^{-1}$, as shown in FIG. 4. The breakdown voltage is about 58 V, as shown in FIG. 5, corresponding to a breakdown field strength of about 9 MV/cm.

All the above results indicate that the $SiO_2$ deposited substrate obtained from example 1 is good enough to be used in semiconductor devices, such as amorphous silicon or polycrystalline silicon thin film transistors.

APPLIED EXAMPLE 2

The same procedures as described in applied example 1 were employed to fabricate a MOS capacitor, except that the substrate used was produced according to example 1, in which 0.01M boric acid was added to the treatment solution. The oxide thickness was about 55 nm.

Figure 6:
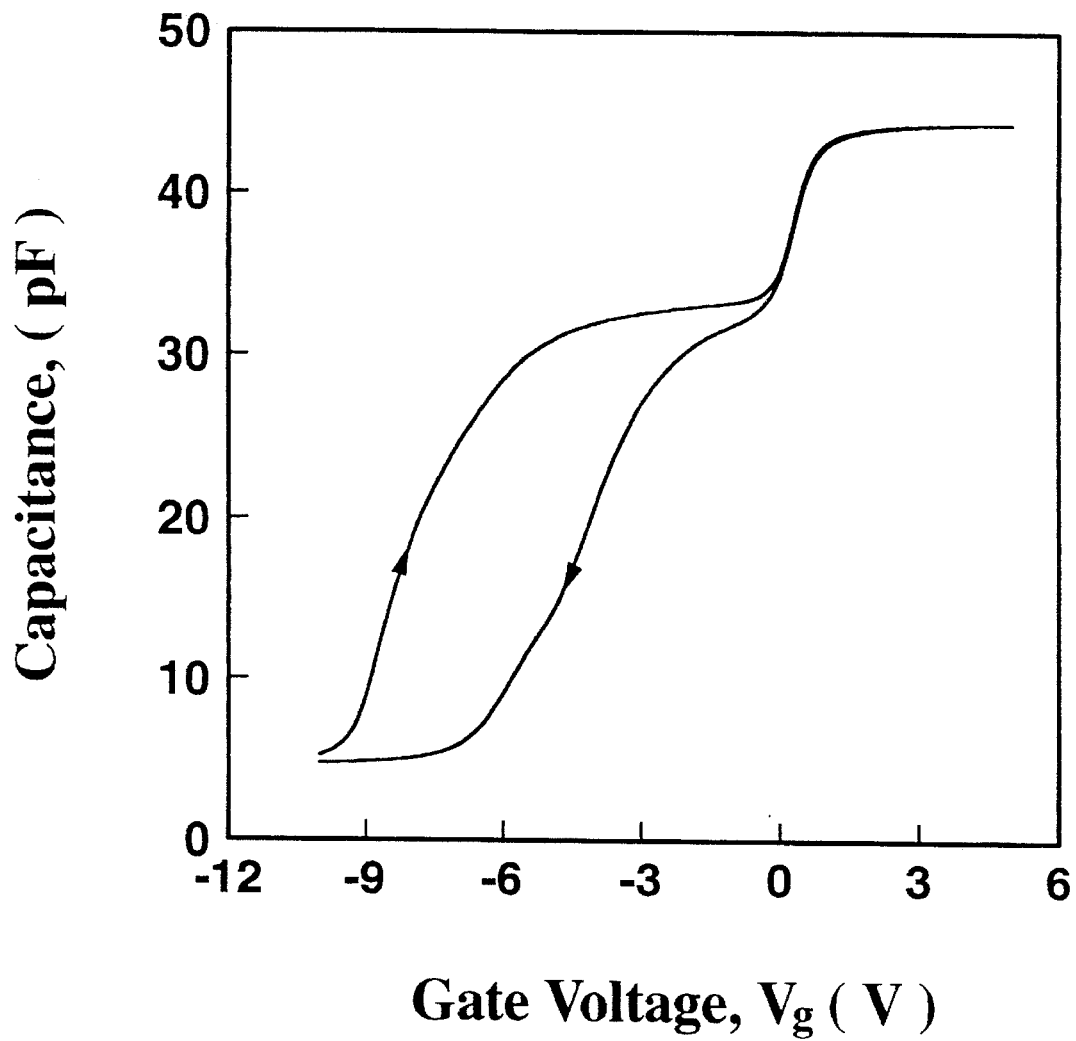
FIG. 6 shows the high-low frequency capacitance versus voltage (C-V) curves of the MOS capacitor prepared from applied example 2.

FIG. 6 shows the high frequency C-V characteristics of the capacitor. It is apparent that the C-V curves exhibit two step structures. The upper step looks similar to that observed in FIG. 3, having a nearly zero flatband voltage and no slow states. The lower step behaves very differently. Not only does the flatband voltage shift to a very negative value, but also a very large quantity of slow states appear. Comparing FIG. 3 with FIG. 6 suggests that the addition of boric acid may lead to the shift of the flatband voltage toward a negative value, and the generation of slow states and interface trap states.

What is claimed is:

1. A process for depositing a silicon dioxide film on a substrate, comprising the steps of:

(a) saturating a hydrofluorosilicic acid solution by adding hydrated silica to hydrofluorosilicic acid;

(b) diluting the saturated hydrofluorosilicic acid solution with water to obtain a hydrofluorosilicic acid solution supersaturated with silicon dioxide to an extent necessary to deposit the silicon dioxide film on a surface of the substrate; and (c) contacting the substrate with the solution resulting from step (b) and depositing the silicon dioxide film on the surface of the substrate and said dilution step in (b) above being employed after the step in (a) above.

2. The process as claimed in claim 1, further comprising the step of adding a saturating agent to the solution obtained from step (b) of claim 1, whereby said saturating agent is capable of reacting with fluoric acid and makes the solution more supersaturated with silicon dioxide.

3. The process as claimed in claim 2, wherein the saturating agent capable of reacting with fluoric acid is selected from the group consisting of boric acid, aluminum, water containing ammonia therein and sodium hydroxide.

4. The process as claimed in claim 3, wherein the saturating agent is boric acid.

5. A process for preparing a hydrofluorosilicic acid solution supersaturated with silicon dioxide, said solution being capable of being used to deposit a silicon dioxide film on a substrate, comprising the steps of:

(a) saturating a hydrofluorosilicic acid solution by adding hydrated silica to hydrofluorosllicic acid; and (b) diluting the saturated hydrofluorosilicic acid solution with water to obtain a hydrofluorosilicic acid solution supersaturated with silicon dioxide, and said dilution step in (b) above being employed after the step in (a) above.

6. The process as claimed in claim 5, further comprising the step of adding adding a saturating agent to the solution obtained from step (b) of claim 5, whereby said saturating agent is capable of reacting with fluoric acid and makes the solution more supersaturated with silicon dioxide.

7. The process as claimed in claim 6, wherein the saturating agent capable of reacting with fluoric acid is selected from the group consisting of boric acid, aluminum, water containing ammonia therein and sodium hydroxide.

8. A process for preparing a hydrofluorosilicic acid solution supersaturated with silicon dioxide, said solution being capable of being used to deposit a silicon dioxide film on a substrate and for depositing said silicon dioxide film on a substrate, comprising the steps of:

(a) saturating a hydrofluorosilicic acid solution by adding hydrated silica to hydrofluorosilicic acid;

(b) diluting the saturated hydrofluorosilicic acid solution with water to obtain a hydrofluorosilicic acid solution supersaturated with silicon dioxide;

(c) adding a saturating agent selected from the group consisting of boric acid, aluminum, water containing ammonia therein, and sodium hydroxide to the solution obtained from step (b); and, (d) contacting the substrate with the solution resulting from step (b) and depositing the silicon dioxide film on the surface of the substrate, said contacting step in (d) above being employed after the step (c) above, said addition step in (c) above being employed after the step (b) above, and said dilution step in (b) above being employed after the step in (a) above.

* * * * *